United States Patent
Kim et al.

(10) Patent No.: US 11,862,106 B2
(45) Date of Patent: Jan. 2, 2024

(54) SCAN DRIVER AND DISPLAY APPARATUS COMPRISING THE SAME

(71) Applicant: Samsung Display Co., Ltd., Yongin-si (KR)

(72) Inventors: Jonghee Kim, Yongin-si (KR); Bogyeong Kim, Yongin-si (KR); Dooyoung Lee, Yongin-si (KR); Takyoung Lee, Yongin-si (KR); Sanguk Lim, Yongin-si (KR); BoYong Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/980,425

(22) Filed: Nov. 3, 2022

(65) Prior Publication Data

US 2023/0169926 A1 Jun. 1, 2023

(30) Foreign Application Priority Data

Dec. 1, 2021 (KR) .................. 10-2021-0170188

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2300/0842* (2013.01); *G09G 2310/0286* (2013.01); *G09G 2310/08* (2013.01); *G09G 2320/0233* (2013.01); *G09G 2320/041* (2013.01); *G09G 2320/045* (2013.01)

(58) Field of Classification Search
CPC .............. G09G 3/3266; G09G 3/3233; G09G 2300/0842; G09G 2310/0286; G09G 2310/08; G09G 2320/0233; G09G 2320/041; G09G 2320/045
See application file for complete search history.

(56) References Cited

U.S. PATENT DOCUMENTS

| | | | |
|---|---|---|---|
| 10,810,946 B2 | 10/2020 | Han et al. | |
| 2017/0004760 A1* | 1/2017 | Jang | G09G 3/3677 |
| 2020/0020266 A1* | 1/2020 | Feng | G11C 19/28 |
| 2020/0074933 A1* | 3/2020 | Ban | G09G 3/3283 |
| 2020/0082762 A1* | 3/2020 | Takasugi | G09G 3/3266 |
| 2020/0372851 A1* | 11/2020 | Kim | G09G 3/2092 |
| 2021/0142714 A1 | 5/2021 | Sung et al. | |
| 2021/0174748 A1 | 6/2021 | Park et al. | |

FOREIGN PATENT DOCUMENTS

| | | |
|---|---|---|
| KR | 10-1277937 B1 | 6/2013 |
| KR | 10-1286515 B1 | 7/2013 |
| KR | 10-1319356 B1 | 10/2013 |
| KR | 10-2019-0037749 A | 4/2019 |
| KR | 10-2020-0007317 A | 1/2020 |
| KR | 10-2020-0119954 A | 10/2020 |
| KR | 10-2021-0055860 A | 5/2021 |

\* cited by examiner

*Primary Examiner* — Premal R Patel
(74) *Attorney, Agent, or Firm* — Lewis Roca Rothgerber Christie LLP

(57) ABSTRACT

A scan driver includes stages, and first to third clock signals are applied to the stages, respectively. A falling time of the first clock signal is shorter than falling times of the second and third clock signals.

20 Claims, 13 Drawing Sheets

SCAN DRIVER AND DISPLAY APPARATUS COMPRISING THE SAME

CROSS-REFERENCE TO RELATED APPLICATION

The present application claims priority to and the benefit of Korean Patent Application No. 10-2021-0170188, filed on Dec. 1, 2021, in the Korean Intellectual Property Office, the entire disclosure of which is incorporated herein by reference.

BACKGROUND

1. Field

Aspects of some embodiments of the present disclosure relate to a scan driver and a display apparatus including the same.

2. Description of the Related Art

A display apparatus includes a pixel unit including a plurality of pixels, a scan driver, a data driver, a controller, and the like. The scan driver may include a plurality of stages connected to scan lines, and the stages may be configured to provide scan signals to the scan lines connected thereto, in response to signals from the controller.

The above information disclosed in this Background section is only for enhancement of understanding of the background and therefore the information discussed in this Background section does not necessarily constitute prior art.

SUMMARY

Aspects of some embodiments of the present disclosure include a scan driver that may be capable of reducing the heat emission from a display panel and a display apparatus including the scan driver. The characteristics of embodiments according to the present disclosure are not limited to the characteristics stated above, and other characteristics that are not mentioned could be clearly understood by one of ordinary skill in the art from the description below of some embodiments of the present disclosure.

Additional aspects will be set forth in part in the description which follows and, in part, will be more apparent from the description, or may be learned by practice of the presented embodiments of the disclosure.

According to some embodiments, a scan driver includes a plurality of stages, wherein each of the plurality of stages includes a node controller configured to control a voltage level of a first control node, a first output controller including a first pull-up transistor connected between a first clock input terminal and a first output terminal, to which a first clock signal is applied, and configured to output the first clock signal as a first scan signal when the first control node has an on-voltage level, a second output controller including a second pull-up transistor connected between a second clock input terminal and a second output terminal, to which a second clock signal is applied, and configured to output the second clock signal as a second scan signal when the first control node has the on-voltage level, and a third output controller including a third pull-up transistor connected between a third clock input terminal and a third output terminal, to which a third clock signal is applied, and configured to output the third clock signal as a carry signal when the first control node has the on-voltage level, wherein a falling time of the first clock signal is shorter than falling times of the second clock signal and the third clock signal.

According to some embodiments, a rising time of the first clock signal may be identical to rising times of the second clock signal and the third clock signal.

According to some embodiments, a rising time of the first clock signal may be shorter than rising times of the second clock signal and the third clock signal.

According to some embodiments, a rising time of the first clock signal may be identical to a rising time of the second clock signal and shorter than a rising time of the third clock signal.

According to some embodiments, an on time of the first clock signal, which is a period when the on-voltage level of the first clock signal is maintained, may be identical to on times of the second clock signal and the third clock signal.

According to some embodiments, an on time of the first clock signal, which is a period when the on-voltage level of the first clock signal is maintained, may be longer than on times of the second clock signal and the third clock signal.

According to some embodiments, an on time of the first clock signal, which is a period when the on-voltage level of the first clock signal is maintained, may be longer than an on time of the second clock signal and shorter than an on time of the third clock signal.

According to some embodiments, the first clock signal may be transited from an on-voltage level to an off-voltage level in a same point in time as transition points in time of the second and third clock signals, and the first clock signal may be transited to the off-voltage level faster than the second and third clock signals.

According to some embodiments, the first clock signal may be transited from the off-voltage level to the on-voltage level in a same point in time as the transition points in time of the second and third clock signals, and the first clock signal may be transited to the on-voltage level faster than the second and third clock signals.

According to some embodiments, the first clock signal may be transited from an on-voltage level to an off-voltage level in a same point in time as a transition point in time of the second clock signal and transited to the off-voltage level faster than the second clock signal, and the first clock signal may be transited from the off-voltage level to the on-voltage level in the same point in time as the transition point in time of the second clock signal and transited to the on-voltage level faster than the second clock signal.

According to some embodiments, a period of time when the third clock signal maintains the on-voltage level may be greater than periods of time when the first and second clock signals maintain the on-voltage level.

According to some embodiments, the scan driver may further include an inverter connected between the first control node and the second control node and configured to invert a voltage of the first control node and provide the inverted voltage to the second control node, wherein the first output controller may include a first pull-down transistor connected between a first voltage input terminal and a first output terminal, to which a first voltage having an off-voltage level is applied, and configured to output the first voltage as a first scan signal when the second control node has an on-voltage level, the second output controller may include a second pull-down transistor connected between the first voltage input terminal and a second output terminal and configured to output the first voltage as a second scan signal when the second control node has the on-voltage level, the third output controller may include a third pull-down transistor connected between a second voltage input terminal and a third output terminal, to which a second voltage having an off-voltage level is applied, and configured to output the second voltage as a carry signal when the second control node has the on-voltage level, and the first voltage may be lower than the second voltage.

According to some embodiments, a display apparatus includes a pixel unit including a plurality of pixels, and a scan driver including a plurality of stages configured to respectively output a first scan signal and a second scan signal to the plurality of pixels, wherein each of the plurality of stages includes a node controller configured to control a voltage level of a first control node, a first output controller configured to output a first clock signal as the first scan signal when the first control node has an on-voltage level, a second output controller configured to output a second clock signal as the second scan signal when the first control node has the on-voltage level, and a third output controller configured to output a third clock signal as a carry signal when the first control node has the on-voltage level, wherein a falling time of the first clock signal is shorter than falling times of the second and third clock signals.

According to some embodiments, a rising time of the first clock signal may be identical to rising times of the second and third clock signals.

According to some embodiments, a rising time of the first clock signal may be shorter than rising times of the second and third clock signals.

According to some embodiments, a rising time of the first clock signal may be identical to a rising time of the second clock signal and shorter than a rising time of the third clock signal.

According to some embodiments, an on time of the first clock signal, which is a period when the first clock signal maintains the on-voltage level, may be identical to on times of the second and third clock signals.

According to some embodiments, an on time of the first clock signal, which is a period when the first clock signal maintains the on-voltage level, may be longer than on times of the second and third clock signals.

According to some embodiments, an on time of the first clock signal, which is a period when the first clock signal maintains the on-voltage level, may be longer than an on time of the second clock signal and shorter than an on time of the third clock signal.

According to some embodiments, the display apparatus may further include an inverter connected between the first control node and the second control node and configured to invert a voltage of the first control node and provide the inverted voltage to the second control node, wherein the first output controller is configured to output a first voltage having an off-voltage level as the first scan signal when the second control node has the on-voltage level, the second output controller is configured to output the first voltage having the off-voltage level as the second scan signal when the second control node has the on-voltage level, the third output controller is configured to output the second voltage having the off-voltage level as a carry signal when the second control node has the on-voltage level, and the first voltage is lower than the second voltage.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
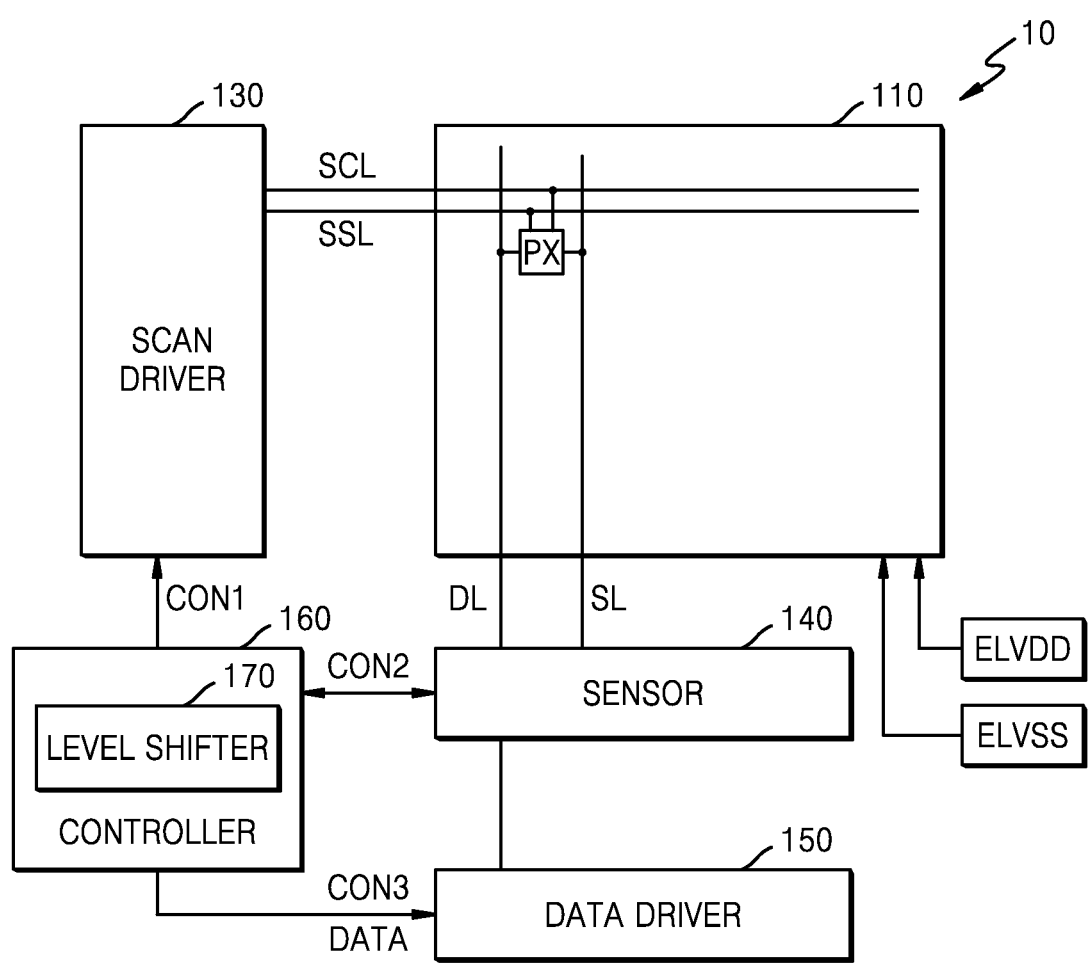
FIG. 1 is a schematic block diagram of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, aspects of some embodiments will be illustrated in the drawings and described in more detail in the written description. The attached drawings for illustrating aspects of some embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

It will be understood that although the terms "first", "second," etc. may be used herein to describe various elements, these elements should not be limited by these terms, and these elements are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

Sizes of elements in the drawings may be exaggerated for convenience of explanation. In other words, since sizes and thicknesses of elements in the drawings are arbitrarily illustrated for convenience of explanation, the following embodiments are not limited thereto.

In the present embodiments, an expression such as "A and/or B" indicates A, B, or A and B. Also, an expression such as "at least one of A and B" indicates A, B, or A and B.

It will be understood that when X is connected to Y, X may be electrically connected, functionally connected, or directly connected to Y. Here, X and Y may each be an object (e.g., an apparatus, a device, a circuit, a wire, an electrode, a terminal, a conductive layer, a layer, or the like). Therefore, a connection relationship between X and Y is not limited to a certain connection relationship, e.g., a connection relationship illustrated in the drawings or stated in the detailed description, and may include relationships other than the connection relationship in the drawings or detailed description.

When X is electrically connected to Y, there may be, for example, at least one device (e.g., a switch, a transistor, a capacitor device, an inductor, a resistor, a diode, or the like), which enables an electrical connection between X and Y, between X and Y.

In embodiments below, the term "on" used in relation to a device state may indicate an activation state of the device, and the term "off" may indicate an inactivation state of the device. The term "on" used in relation to a signal received by a device may indicate a signal for activating a device, and the term "off" may indicate a signal for inactivating the device. The device may be activated according to a high-level voltage or a low-level voltage. For example, a P-channel transistor may be activated according to a low-level voltage, and an N-channel transistor may be activated according to a high-level voltage. Therefore, "on" voltages of the P-channel transistor and the N-channel transistor have opposite voltage levels (low vs. high).

FIG. 1 is a schematic block diagram of a display apparatus according to some embodiments.

A display apparatus 10 according to some embodiments may be realized as or incorporated into an electronic apparatus such as a smartphone, a cell phone, a smartwatch, a navigation device, a game device, a television (TV), an automotive head unit, a laptop computer, a tablet computer, a Personal Media Player (PMP), or a Personal Digital Assistants (PDA). Also, the electronic apparatus may be a flexible apparatus.

Referring to FIG. 1, the display apparatus 10 may include a pixel unit 110, a scan driver 130, a sensor 140, a data driver 150, and a controller 160.

According to some embodiments, the display apparatus 10 may operate in a sensing period, in which the display apparatus 10 operates in a sensing mode, or a driving period, in which the display apparatus 10 operates in a display mode. The sensing period may be a period in which characteristic information of each of pixels PX included in the pixel unit 110, for example, at least one of a threshold voltage, mobility, and deterioration information of a driving transistor and/or an organic light-emitting diode included in each pixel PX, is extracted. The driving period may be a period in which a certain image is displayed by the pixels PX included in the pixel unit 110, in response to data signals. According to some embodiments, the sensing period may be shown after power is applied (power on), between the driving periods, and before power is turned off (power off).

The scan driver 130 may be connected to scan lines SCL and SSL, generate scan signals in response to a first control signal CONT1 from the controller 160, and thus sequentially provide the scan signals to the scan lines SCL and SSL. The scan signal may be a signal having a pulse of an on-voltage at which a transistor included in the pixel PX may be turned on. The on-voltage may be a high-level or low-level voltage. The scan driver 130 may include a shift register. For example, the scan driver 130 may be configured to sequentially provide the scan signals to the scan lines SCL and SSL during the sensing period and the driving period.

The sensor 140 may be connected to sensing lines SL and sense characteristic information from the pixels PX through the sensing lines SL during the sensing period, in response to a second control signal CONT2 from the controller 160. According to some embodiments, the sensing line SL may be included in each vertical line (a column). According to some embodiments, one sensing line SL may be shared by pixels PX in multiple columns. The sensor 140 may convert the sensed characteristic information into sensing data in a digital form and may output the sensing data. The sensing data may be used to convert data to compensate for a characteristic deviation of the pixels PX. The sensor 140 may include a plurality of sensing integrated circuits (ICs). The sensing ICs may be realized as readout ICs configured to extract the characteristic information of the pixels PX. The sensor 140 may be enabled in the sensing period and disabled in the driving period.

The data driver 150 may be connected to a plurality of data lines DL and provide data signals to the data lines DL during the data period, in response to a third control signal CONT3 from the controller 160. The data driver 150 may generate the data signals according to data DATA provided from the controller 160 during the driving period. The data signals in the form of a voltage or a current that are generated by the data driver 150 may be provided to the data lines DL. The data signals provided to the data lines DL may be provided to the pixels PX selected in response to the scan signals. The pixels PX may emit light having a brightness corresponding to the data signal during the driving period, and thus, images may be displayed on the pixel unit 110.

According to some embodiments, the data driver 150 may provide a reference voltage to the data lines DL during the sensing period, according to the control of the controller 160. For example, the reference voltage may be set to be a certain voltage at which a current may flow from driving transistors included in the pixels PX. According to some embodiments of the present disclosure, the data driver 150 does not necessarily provide the reference voltage to the pixels PX during the sensing period. For example, when the pixels PX are connected to other voltage sources and/or current sources, the data driver 150 may drive the data lines DL only in the driving period.

In the pixel unit 110, the scan lines SCL and SSL, the data lines DL, the sensing lines SL, and the pixels PX connected thereto may be included. The pixels PX may be repeatedly arranged along a first direction (an x direction, a row direction) and a second direction (a y direction, a column direction). The scan lines SCL and SSL may be regularly separated or spaced apart from each other, may be arranged in a row, and may provide the scan signals, respectively. The data lines DL may be regularly separated from each other, may be arranged in a column, and may provide the data signals, respectively. The sensing lines SL may be regularly separated from each other, may be arranged in a column, and may sense the characteristic information of each pixel PX. According to some embodiments, in the case of an organic electroluminescent display apparatus, the pixels PX may be driven according to a driving voltage ELVDD and a common voltage ELVSS. The pixels PX may output the characteristic information through the sensing lines SL during the sensing period, and may emit light in response to the data signals provided through the data lines DL during the driving period.

The controller 160 may control the operations of the scan driver 130, the sensor 140, and the data driver 150. Also, the controller 160 may store, in a memory, sensing data from the sensor 140, compensate for data that is input from the outside by using the stored sensing data, and output the compensated data DATA to the data driver 150. According to some embodiments, the data DATA and the sensing data may be digital signals.

The controller 160 may include a level shifter 170. However, one or more embodiments are not limited thereto. According to some embodiments, for example, the level shifter 170 may be separately formed on the outside of the controller 160.

The level shifter 170 may generate the first to third control signals CONT1 to CONT3 according to the clock signal, the control signal, etc. The first control signal CONT1 may include a scan start signal, the clock signals, etc. The second control signal CONT2 may include a sensing start signal, the clock signals, switch control signals, etc. The third control signal CONT3 may include a source start signal, the clock signals, etc.

The display apparatus 10 may include the display panel, and the display panel may include a substrate. The display apparatus 10 may include a display area, where an image is displayed, and a non-display area surrounding the display area outside the display area. The pixel unit 110 may be arranged in the display area of the substrate, and driving circuits such as the scan driver 130, the sensor 140, and the data driver 150 may be arranged in the non-display area. For example, some or all portions of the scan driver 130 may be directly formed in the non-display area of the substrate in a process of forming a transistor that forms a pixel circuit in the display area of the substrate in a Gate In Panel (GIP) manner.

The data driver 150 may be arranged on a Flexible Printed Circuit Board (FPCB) electrically connected to a pad that is on one side of the substrate. According to some embodiments, the data driver 150 may be directly arranged on the substrate in a Chip On Glass (COG) manner or a Chip On Plastic (COP) manner.

Hereinafter, a case where the display apparatus 10 is an organic light-emitting display apparatus is described, but the display apparatus is not limited thereto. According to some embodiments, the display apparatus 10 may be a display apparatus such as an inorganic light-emitting display apparatus (or an inorganic EL display apparatus) or a quantum dot light-emitting display apparatus.

Figure 2:
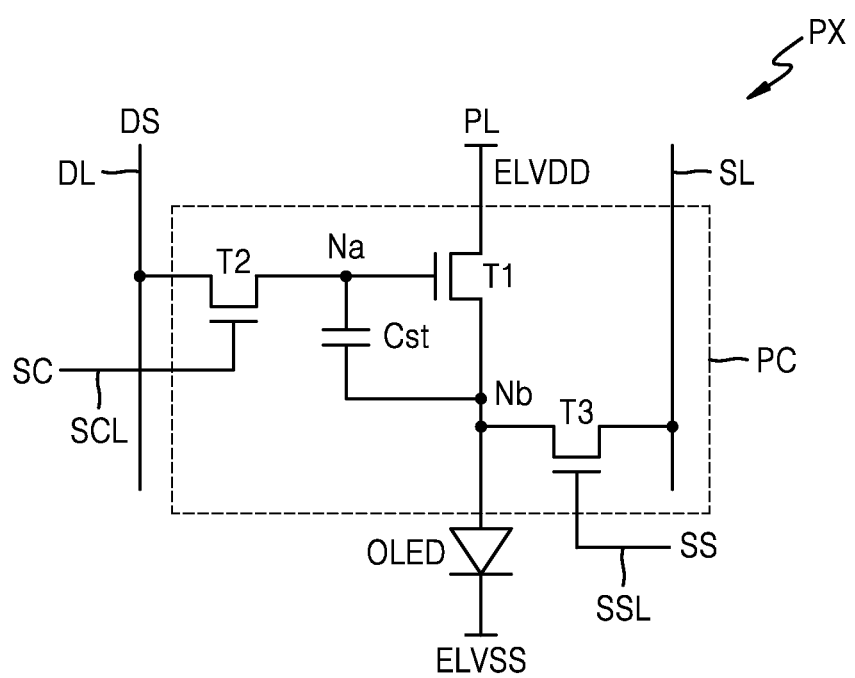
FIG. 2 is an equivalent circuit diagram of a pixel according to some embodiments.

FIG. 2 is an equivalent circuit diagram of a pixel according to some embodiments.

Referring to FIG. 2, each pixel PX may include a pixel circuit PC and an organic light-emitting diode OLED connected to the pixel circuit PC as a display element. The pixel circuit PC includes a first transistor (T1, a driving transistor), a second transistor (T2, a switching transistor), a third transistor (T3, a sensing control transistor), and a capacitor Cst.

The first transistor T1 may include a first electrode connected to a driving power line PL configured to provide a driving voltage ELVDD, and a second electrode connected to a second node Nb. A gate electrode of the first transistor T1 may be connected to a first node Na. The first transistor T1 may control a driving current flowing in the organic light-emitting diode OLED from the driving power line PL, according to a voltage stored in the capacitor Cst.

The second transistor T2 may include a gate electrode connected to a first scan line SCL, a first electrode connected to the data line DL, and a second electrode connected to the first node Na. The second transistor T2 may be turned on in response to a first scan signal SC input through the first scan line SCL, may electrically connect the data line DL to the first node Na, and may be configured to transmit, to the first node Na, the data signal DS input through the data line DL.

The third transistor T3 may include a gate electrode connected to a second scan line SSL, a first electrode connected to the second electrode of the first transistor T1, and a second electrode connected to the sensing line SL. The third transistor T3 may be turned on in response to a second scan signal SS provided through the second scan line SSL during the sensing period and may electrically connect the sensing line SL to the second electrode of the first transistor T1.

The capacitor Cst may be connected between the first node Na and the second electrode of the first transistor T1. The capacitor Cst may store a voltage corresponding to a difference between a voltage from the second transistor T2 and a potential of the second electrode of the first transistor T1.

The organic light-emitting diode OLED may include a first electrode (a pixel electrode, an anode) connected to the second node Nb and a second electrode (an opposite electrode, a cathode) to which a common voltage ELVSS is applied. The organic light-emitting diode OLED may emit light having a certain brightness because of the driving current.

FIG. 2 illustrates that transistors of the pixel circuit are N-type transistors, but one or more embodiments are not limited thereto. For example, the transistors of the pixel circuit may be P-type transistors, or some of the transistors may be P-type transistors, and others thereof may be N-type transistors.

According to some embodiments, the first transistor T1 may at least be an oxide semiconductor transistor that includes an active layer including an amorphous or crystalline oxide semiconductor. For example, the first to third transistors T1 to T3 may each be an oxide semiconductor transistor. The oxide semiconductor transistor may have great off-current characteristics. Alternatively, according to some embodiments, at least one of the first to third transistors T1 to T3 may be a Low-Temperature Poly-Silicon (LTPS) thin film transistor including an active layer including polysilicon. The LTPS thin film transistor may have high electron mobility and thus have fast driving characteristics.

Figure 3:
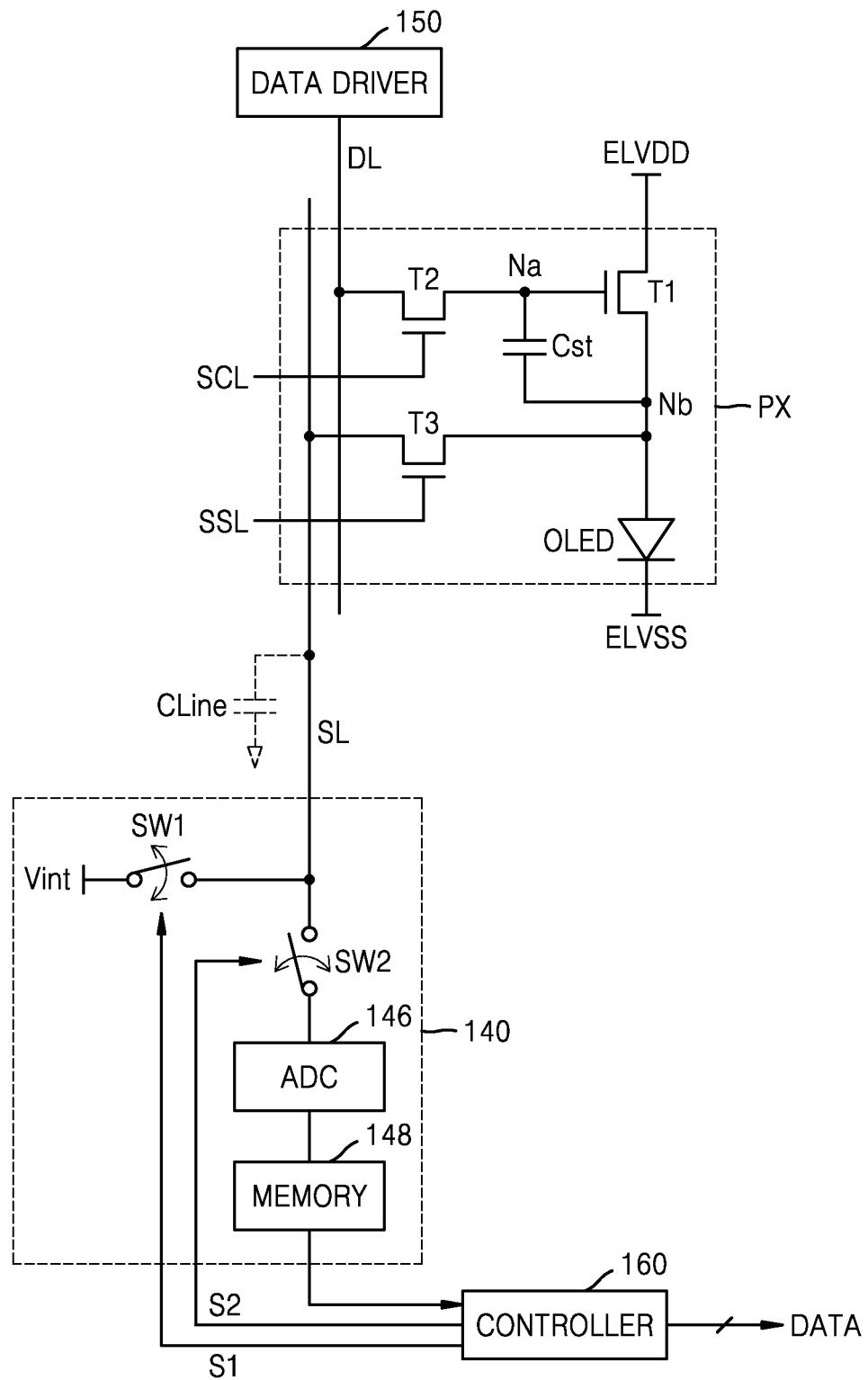
FIG. 3 is a diagram for explaining operations of a pixel and a sensor, according to some embodiments.

FIG. 3 is a diagram for explaining operations of a pixel and a sensor, according to some embodiments.

The sensor 140 may include a first switching device SW1, a second switching device SW2, and at least one Analog-Digital Converter (ADC) 146.

The first switching device SW1 may be connected between the sensing line SL and an initialization voltage source. The first switching device SW1 may be turned on in response to a first control signal S1 provided from the controller 160 and may provide an initialization voltage Vint from the initialization voltage source to the sensing line SL.

The second switching device SW2 may be connected between the sensing line SL and the ADC 146. The second switching device SW2 may be turned on in response to a second control signal S2 provided from the controller 160 and may connect the sensing line SL to the ADC 146.

The ADC 146 may sense a voltage or a current of the sensing line SL. The ADC 146 may convert sensed analog characteristic information into digital sensing data.

The sensor 140 may further include a memory 148 connected to the ADC 146. The memory 148 may function as a buffer in which the digital sensing data from the ADC 146 is temporarily stored. In the memory 148, digital sensing data corresponding to the characteristic information of each pixel may be stored. The digital sensing data stored in the memory 148 may be provided to the controller 160.

The controller 160 may output data DATA, which is obtained after the characteristic deviation between the pixels PX is compensated for, based on sensing data including the characteristic information of each pixel PX.

During the sensing period, the data driver 150 may provide, to the data line DL, a reference voltage at which a current from the pixels PX may flow. According to some embodiments, the data driver 150 may not provide the reference voltage. In this case, in the sensing period, the data lines DL may be electrically connected to a certain current source and/or a voltage source to drive the pixels PX.

Also, in a certain period of the sensing period, the first scan signal SC and the second scan signal SS may be respectively provided to the first scan lines SCL and the second scan lines SSL. In the pixels PX in a row to which the first scan signal SC and the second scan signal SS are provided, the second transistor T2 and the third transistor T3 may be turned on. When the second transistor T2 is turned on, the reference voltage from the data line DL may be transmitted to the first node Na.

When the third transistor T3 is turned on, the first switching device SW1 may be turned on in response to the first control signal S1, and the initialization voltage Vint may be provided to a node, which is connected to the second electrode of the first transistor T1, through the sensing line SL.

Then, the first switching device SW1 may be turned off, and the second switching device SW2 may be turned on in response to the second control signal S2; thus, the second electrode of the first transistor T1 may be electrically connected to the sensing line SL. The reference voltage is applied to the first node Na, and the first transistor T1 is turned on. Accordingly, in the pixels PX in a corresponding row, a current corresponding to the reference voltage may be generated, and the current may be provided to the sensing line SL via the third transistor T3 of the pixels PX.

The sensing line SL may have a certain resistance value, and thus, a voltage corresponding to a certain current flowing in a corresponding pixel PX may be applied to each sensing line SL. The voltage applied to the sensing line SL may be stored in a line capacitor CLine parasitically generated in the sensing line SL. The voltage stored in the sensing line SL may include characteristic information of the first transistor T1 included in the pixel PX of a currently sensed row. The current flowing in the first transistor T1 according to the reference voltage may correspond to a threshold voltage, mobility, and deterioration information of the first transistor T1. A method of extracting the characteristic information of the pixel PX is not limited to the embodiments described above. For example, the characteristic information of the pixel PX may be extracted in various ways that are well known.

During the driving period, the data DATA, which is output from the controller 160, may be input to the data driver 150, and the data driver 150 may generate the data signals corresponding to the data DATA and output the generated data signal DS to the data lines DL.

During the driving period, the first and second scan signals SC and SS may be respectively provided to the first and second scan lines SCL and SSL. In the pixels PX of a row, to which the first and second scan signals SC and SS are transmitted, the second and third transistors T2 and T3 may be turned on. When the second transistor T2 is turned on, the data signal from the data line DL may be transmitted to the first node Na of the corresponding pixel PX. When the third transistor T3 is turned on, the initialization voltage Vint from the sensing line SL may be transmitted to the second node Nb of the corresponding pixel PX. Accordingly, a voltage between the first node Na and the second node Nb may be charged in the capacitor Cst. The first transistor T1 is turned on, and the first transistor T1 having turned on may be configured to provide a driving current corresponding to the data signal to the organic light-emitting diode OLED. Accordingly, the driving current flows from the driving power line PL in a current path via the first transistor T1 and the organic light-emitting diode OLED. Then, the organic light-emitting diode OLED may emit light at a brightness corresponding to the driving current. Because the data signal is generated according to the data DATA, the characteristic deviation between the pixels PX may be compensated for, and thus, images having uniform quality may be displayed on the display panel.

Figure 4:
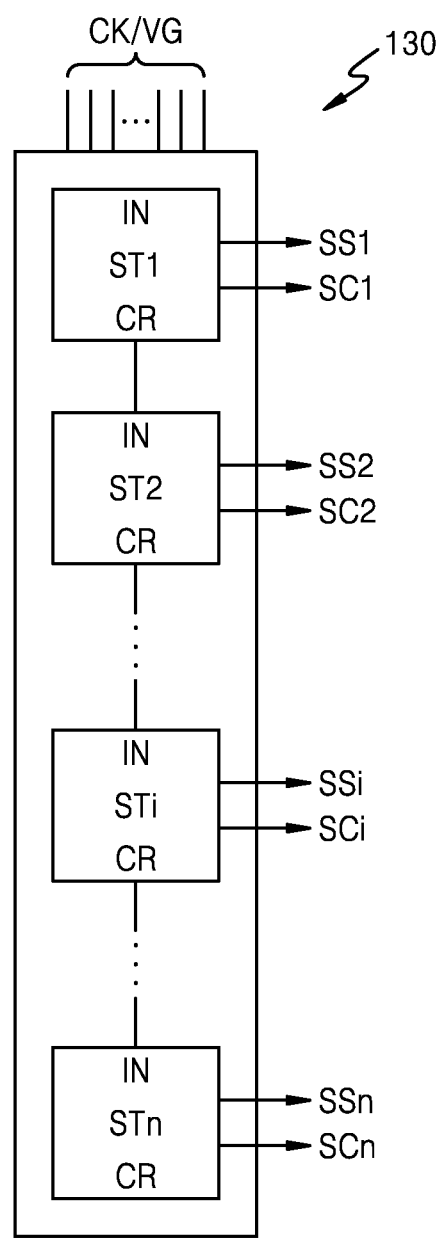
FIG. 4 schematically illustrates a scan driver according to some embodiments.

FIG. 4 schematically illustrates a scan driver according to some embodiments.

Referring to FIG. 4, the scan driver 130 may include first to $n^{th}$ stages ST1 to STn. The first to $n^{th}$ stages ST1 to STn may sequentially output first scan signals SC1 to SCn and second scan signals SS1 to SSn respectively to first scan lines and second scan lines, in one frame period.

Each of the first to $n^{th}$ stages ST1 to STn may be connected to any one of the first scan lines SCL and any one of the second scan lines SSL. Each of the first to $n^{th}$ stages ST1 to STn may receive at least one clock signal CK and at least one voltage signal VG, generate the first scan signal SC to provide the same to the first scan line SCL, and generate the second scan signal SS to provide the same to the second scan line SSL. For example, the $i^{th}$ stage STi may provide the first scan signal SCi to the first scan line SCL and the second scan signal SSi to the second scan line SSL. That is, each of the first to $n^{th}$ stages ST1 to STn may provide the first and second scan signals SC and SS to the first and second scan lines SCL and SSL.

Each of the first to $n^{th}$ stages ST1 to STn may provide a carry signal CR to a front-end stage or a rear-end stage, in response to one of carry clock signals. The front-end stage may be at least one previous stage, and the rear-end stage may be at least one subsequent stage.

Figure 5:
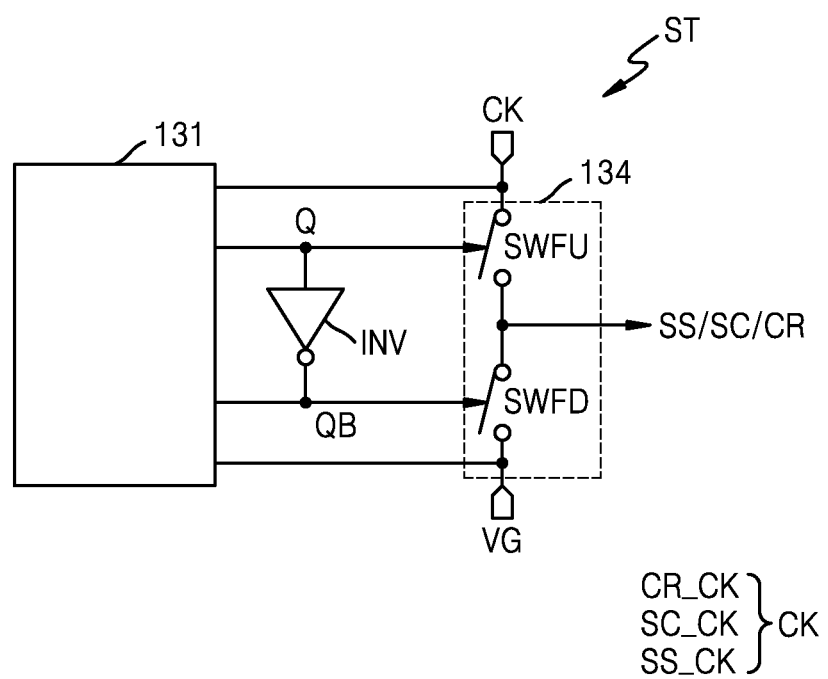
FIG. 5 schematically illustrates an arbitrary stage forming a scan driver, according to some embodiments.

FIG. 5 schematically illustrates an arbitrary stage forming a scan driver, according to some embodiments.

Referring to FIG. 5, a stage ST may include an output controller 134, a node controller 131 controlling a first control node Q, and an inverter INV inverting a voltage of the first control node Q and providing the voltage to a second control node QB. The node controller 131 and the inverter INV may include at least one transistor and at least one capacitor.

The output controller 134 may include a pull-up transistor SWFU for outputting an on-voltage and a pull-down transistor SWFD for outputting an off-voltage. When the pull-up transistor SWFU is turned on, a signal of a high voltage may be output according to the clock signal CK. The pull-up transistor SWFU may include a first pull-up transistor configured to output a first scan signal SC of a high voltage, a second pull-up transistor configured to output a second scan signal SS of a high voltage, and a third pull-up transistor configured to output a carry signal CR of a high voltage. When the pull-down transistor SWFD is turned on, a signal of a low voltage may be output in response to the voltage signal VG. The pull-down transistor SWFD may include a first pull-down transistor configured to output a first scan signal SC of a low voltage, a second pull-down transistor configured to output a second scan signal SS of a low voltage, and a third pull-down transistor configured to output a carry signal CR of a low voltage.

Figure 6:
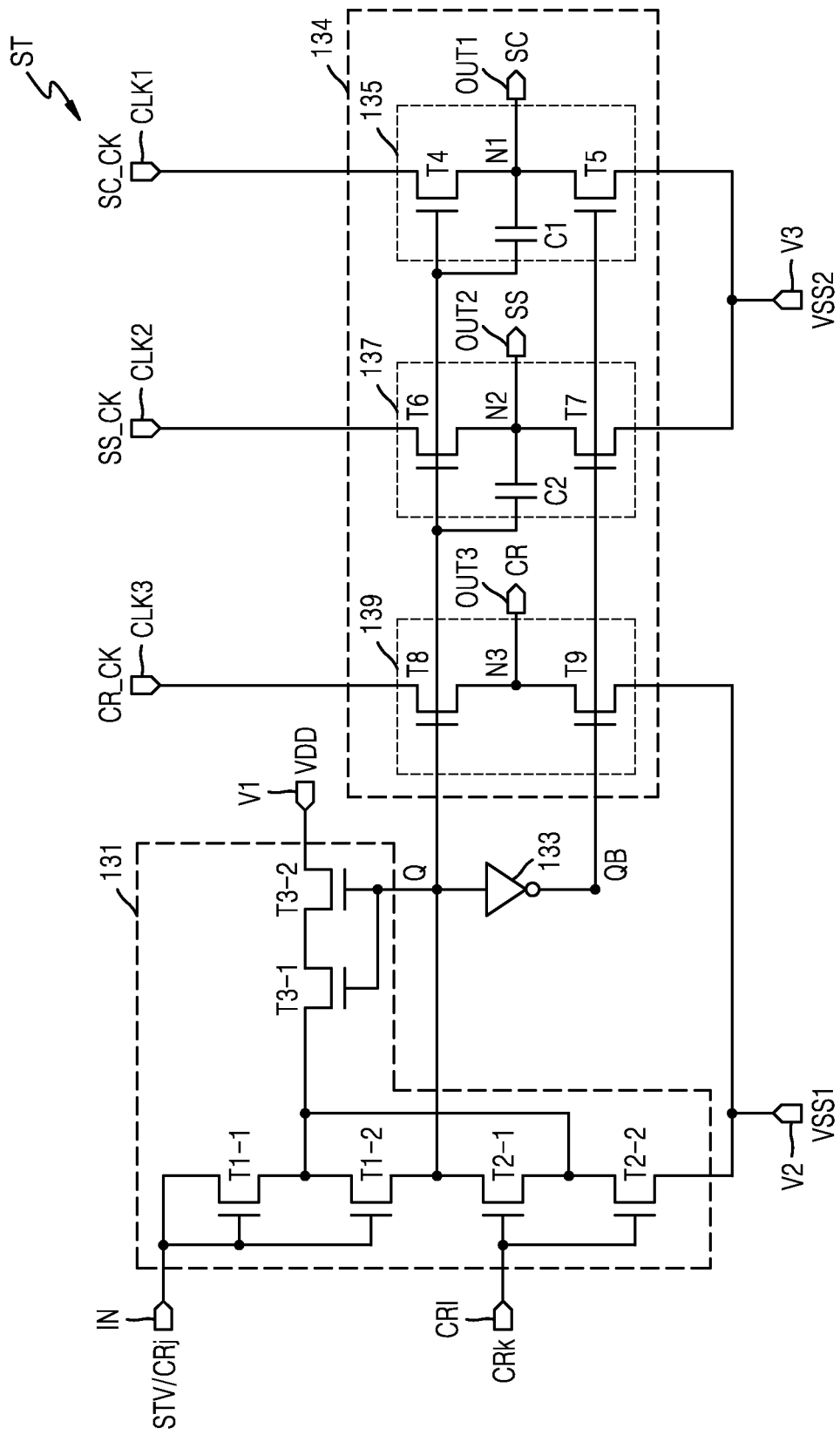
FIG. 6 schematically illustrates a portion of a stage, according to some embodiments.

FIG. 6 schematically illustrates a portion of a stage, according to some embodiments.

Each of the first to $n^{th}$ stages ST1 to STn may include a plurality of nodes, and some of the nodes are referred to as the first to third output nodes N1 to N3 and first and second control nodes Q and QB. Hereinafter, an arbitrary stage ST for outputting the first and second scan signals SC and SS to an arbitrary row of the pixel unit 110 is described as an example.

A first clock signal SC_CK, a second clock signal SS_CK, and a third clock signal CR_CK may be provided to the stage ST. The first clock signal SC_CK, the second clock signal SS_CK, and the third clock signal CR_CK may be square-wave signals in which a high voltage and a low voltage are repeatedly shown. Here, a high-voltage period may be less than a low-voltage period. The high-voltage period may correspond to a pulse width of a scan signal and may be variously set according to a structure of the pixel circuit PC. A pulse width of the first and second scan signals SC and SS may be a period from a point in time, when an off-voltage level (hereinafter, an off voltage) is transited to an on-voltage level (hereinafter, an on voltage), to a point in time when the transition from the on voltage to the off voltage is completed.

The stage ST may include the node controller 131, an inverter 133, and an output controller 134. The output controller 134 may include a first output controller 135, a second output controller 137, and a third output controller 139.

The node controller 131 may be connected between a first voltage input terminal V1 and a second voltage input terminal V2. The node controller 131 may control a voltage of the first control node Q according to a start signal (e.g., an external signal SW or a $j^{th}$ carry signal (CRj) applied to an input terminal IN, a $k^{th}$ carry signal CRk applied to a carry input terminal CRI, a first voltage VDD applied to the first voltage input terminal V1, and a second voltage VSS1 applied to the second voltage input terminal V2. Here, the $j^{th}$ carry signal CRj and the $k^{th}$ carry signal CRk may each be a carry signal of a front-end stage or a rear-end stage. The front-end stage may be at least one previous stage, and the rear-end stage may be at least one subsequent stage. High-voltage periods of the $j^{th}$ carry signal CRj and the $k^{th}$ carry signal CRk do not overlap each other. The first voltage VDD may be set as, for example, an on voltage at which a transistor is turned on. The second voltage VSS1 may be lower than the first voltage VDD and set as, for example, an off voltage. The node controller 131 may include a first transistor, a second transistor, and a third transistor.

The first transistor may include a 1-1 transistor T1-1 and a 1-2 transistor T1-2 that are connected between the input terminal IN and the first control node Q in series. Gates of the 1-1 transistor T1-1 and the 1-2 transistor T1-2 may be connected to the input terminal IN. The 1-1 transistor T1-1 and the 1-2 transistor T1-2 may be turned on in response to start signals STV/CRj of a high voltage provided to the input terminal IN and may provide the start signals STV/CRj to the first control node Q.

The second transistor may include a 2-1 transistor T2-1 and a 2-2 transistor T2-2 that are connected between the first control node Q and the second voltage input terminal V2 in series. Gates of the 2-1 transistor T2-1 and the 2-2 transistor T2-2 may be connected to the carry input terminal CRI. The 2-1 transistor T2-1 and the 2-2 transistor T2-2 may be turned on when the $k^{th}$ carry signal CRk having a high voltage is supplied, and may be configured to set a voltage of the first control node Q as the second voltage VSS1.

An intermediate node (a common electrode) between the 1-1 transistor T1-1 and the 1-2 transistor T1-2 and an intermediate node (a common electrode) between the 2-1 transistor T2-1 and the 2-2 transistor T2-2 may be connected to the third transistor.

The third transistor may include a 3-1 transistor T3-1 and a 3-2 transistor T3-2 that are connected between the first voltage input terminal V1 and intermediate nodes of the first and second transistors in series. Gates of the 3-1 transistor T3-1 and the 3-2 transistor T3-2 may be connected to the first control node Q. The 3-1 transistor T3-1 and the 3-2 transistor T3-2 may be turned on or off according to the voltage of the first control node Q. The third transistor may be turned on when the first control node Q has a high voltage and may maintain the levels of the intermediate nodes of the first and second transistors to high levels, thus reducing the leakage current from the first control node Q.

The first control node Q may be set (pre-charged) to have a high voltage by the start signal STV/CRj and set (discharged) to have a low voltage by the $k^{th}$ carry signal CRk.

The inverter 133 may be connected between the first control node Q and the second control node QB. The inverter 133 may invert the voltage of the first control node Q and provide the inverted voltage to the second control node QB. The inverter 133 may include at least one transistor.

The first output controller 135 may output the first clock signal SC_CK or a third voltage VSS2 to a first output terminal OUT1 connected to a first output node N1, according to the voltages of the first control node Q and the second control node QB. The third voltage VSS2 may be set to be lower than the second voltage VSS1. The first output controller 135 may include a fourth transistor T4 and a fifth transistor T5 connected between a first clock input terminal CLK1 and a third voltage input terminal V3. The first output controller 135 may further include a first capacitor C1.

The fourth transistor T4 may be connected between the first clock input terminal CLK1 and the first output terminal OUT1. A gate of the fourth transistor T4 may be connected to the first control node Q. The fourth transistor T4 may be turned on or off according to a voltage of the first control node Q. The fourth transistor T4 may be a first pull-up transistor. The fourth transistor T4 may be turned on when the first control node Q is set to have a high voltage and may output the first clock signal SC_CK having a high voltage as a high voltage of the first scan signal SC.

The fifth transistor T5 may be connected between the first output terminal OUT1 and the third voltage input terminal V3. A gate of the fifth transistor T5 may be connected to the second control node QB. The fifth transistor T5 may be turned on or off according to the voltage of the second control node QB. The fifth transistor T5 may be a first pull-down transistor. The fifth transistor T5 may be turned on when the second control node QB is set to have a high voltage, and may output the third voltage VSS2 as a low voltage of the first scan signal SC.

The first capacitor C1 may be connected between the first output node N1 and the first control node Q. The fourth transistor T4 may be turned on when the first control node is charged to have a high voltage, the first clock signal SC_CK having a high voltage is output as a high voltage of the first scan signal SC, and in this case, the voltage of the first control node Q may be bootstrapped by the first capacitor C1.

The second output controller 137 may output the second clock signal SC_CK or the third voltage VSS2 to the second output terminal OUT2 connected to the second output node N2, according to the voltages of the first control node Q and the second control node QB. The second output controller 137 may include a sixth transistor T6 and a seventh transistor T7 connected between a second clock input terminal CLK2 and a third voltage input terminal V3. The second output controller 137 may further include a second capacitor C2.

The sixth transistor T6 may be connected between the second clock input terminal CLK2 and the second output terminal OUT2. A gate of the sixth transistor T6 may be connected to the first control node Q. The sixth transistor T6 may be turned on or off according to the voltage of the first control node Q. The sixth transistor T6 may be a second pull-up transistor. The sixth transistor T6 may be turned on when the first control node Q is set to have a high voltage and may output the second clock signal SC_CK having a high voltage as a high voltage of the second scan signal SS.

The seventh transistor T7 may be connected between the second output terminal OUT2 and the third voltage input terminal V3. A gate of the seventh transistor T7 may be connected to the second control node QB. The seventh transistor T7 may be turned on or off according to the voltage of the second control node QB. The seventh transistor T7 may be a second pull-down transistor. The seventh transistor T7 may be turned on when the second control node QB is set to have a high voltage and may output the third voltage VSS2 as a low voltage of the second scan signal SS.

The second capacitor C2 may be connected between the second output node N2 and the first control node Q. The sixth transistor T6 may be turned on when the first control node Q is charged to have a high voltage, the second clock signal SS_CK may be output as a high voltage of the second scan signal SS, and in this case, the voltage of the first control node Q may be bootstrapped by the second capacitor C2.

The third output controller 139 may output the third clock signal CR_CK or the second voltage VSS1 to a third output terminal OUT3 connected to the third output node N3, according to the voltages of the first control node Q and the second control node QB. The third output controller 139 may include an eighth transistor T8 and a ninth transistor T9 connected between the third clock input terminal CLK3 and the second voltage input terminal V2.

The eighth transistor T8 may be connected between the third clock input terminal CLK3 and the third output terminal OUT3. A gate of the eighth transistor T8 may be connected to the first control node Q. The eighth transistor T8 may be turned on or off according to the voltage of the first control node Q. The eighth transistor T8 may be a third pull-up transistor. The eighth transistor T8 may be turned on when the first control node Q is set to have a high voltage and may output the third clock signal CR_CK having a high voltage as a high voltage of the carry signal CR.

The ninth transistor T9 may be connected between the third output terminal OUT3 and the second voltage input terminal V2. A gate of the ninth transistor T9 may be connected to the second control node QB. The ninth transistor T9 may be turned on or off according to the voltage of the second control node QB. The ninth transistor T9 may be a third pull-down transistor. The ninth transistor T9 may be turned on when the second control node QB is set to have a high voltage and may output the second voltage VSS1 as a low voltage of the carry signal CR.

A start signal having a high voltage may be provided to the input terminal IN, the node controller 131 may set the first control node Q to have a high voltage, the first output controller 135 may output the first clock signal SC_CK having a high voltage as the first scan signal SC, the second output controller 137 may output the second clock signal SS_CK having a high voltage as the second scan signal SS, and the third output controller 139 may output the third clock signal CR_CK having a high voltage as the carry signal CR. In this case, the second control node QB may be set to have a low voltage by the inverter INV.

Then, when a voltage of the first control node Q is changed to a low voltage, the first output controller 135 may output the third voltage VSS2 of a low voltage as the first scan signal SC, the second output controller 137 may output the third voltage VSS2 of a low voltage as the second scan signal SS, and the third output controller 139 may output the second voltage VSS1 of a low voltage as the carry signal CR. The second control node QB may be set to have a high voltage by the inverter INV.

Figure 7A:
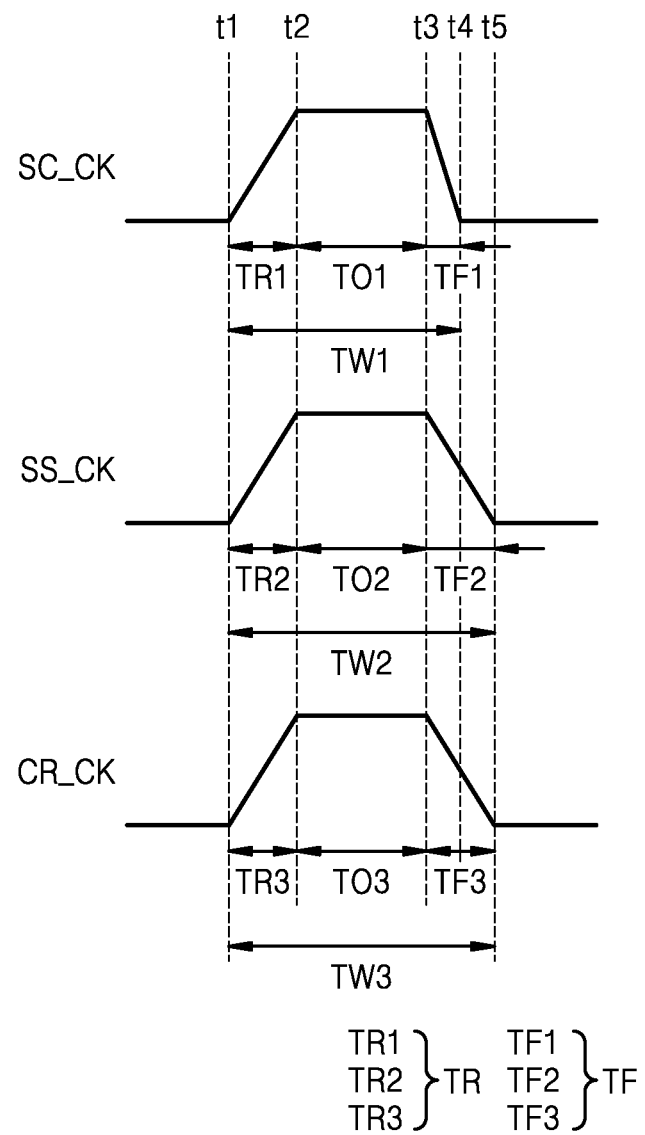
FIGS. 7A and 7B are diagrams illustrating pulses of a clock signal and a scan signal, according to some embodiments.
Figure 7B:
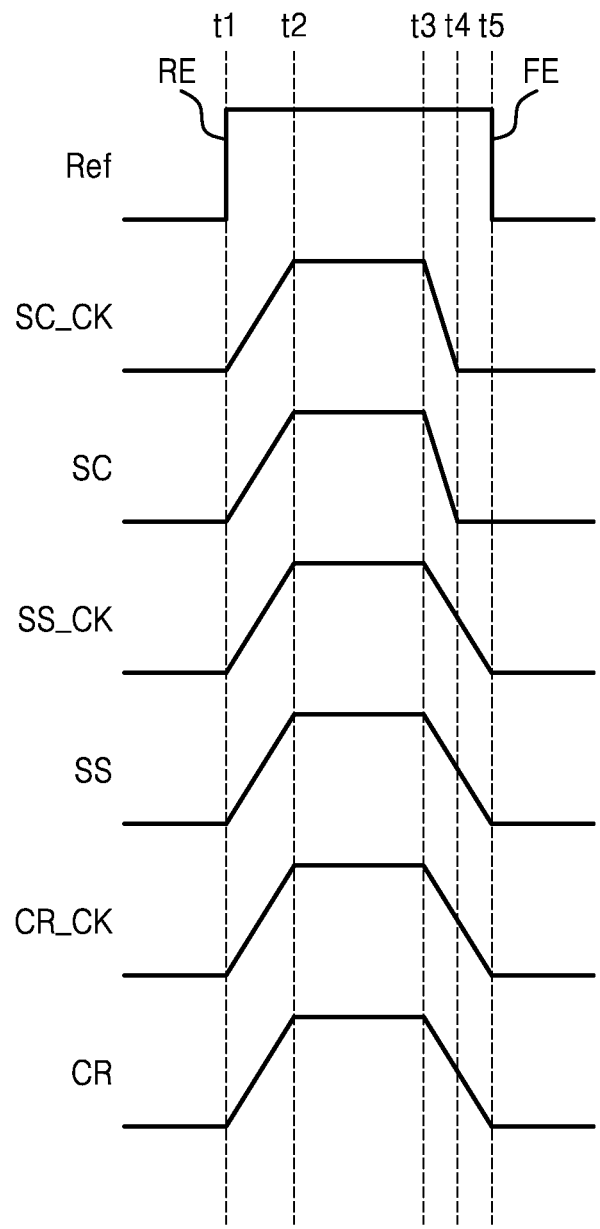

FIGS. 7A and 7B are diagrams illustrating pulses of a clock signal and a scan signal, according to some embodiments.

Referring to FIGS. 7A and 7B, the first clock signal SC_CK, the second clock signal SS_CK, and the third clock signal CR_CK may each be a signal having a high-voltage pulse. The high-voltage pulse may have a pulse width including a rising time TR, which is a period when a low voltage is transited (rises) to a high voltage, a falling time TF, which is a period when a high voltage is transited (drops) to a low voltage, and an on time TO, which is a period when a high voltage is maintained.

A pulse of the first clock signal SC_CK may have a first pulse width TW1 of a first rising time TR1, a first falling time TF1, and a first on time TO1. A pulse of the second clock signal SS_CK may have a second pulse width TW2 of a second rising time TR2, a second falling time TF2, and a second on time TO2. A pulse of the third clock signal CR_CK may have a third pulse width TW3 of a third rising time TR3, a third falling time TF3, and a third on time TO3.

Unlike a reference clock signal Ref having a rising edge RE and a falling edge FE because of vertical rising and falling, rising edges RE and falling edges FE of the first clock signal SC_CK, the second clock signal SS_CK, and the third clock signal CR_CK may rise or fall with certain gradients. The gradient of the rising edge RE may be determined according to the rising time TR, and the gradient of the falling edge FE may be determined according to the falling time TF.

As a resolution increases, an RC load of a clock line may increase, and as charging/discharging of the clock line continues, overheating may be locally observed because of heat emission from a portion of a display panel, to which an IC is attached, and a wiring part that includes the clock lines configured to apply signals to the scan driver.

The level shifter 170 may output a reference clock signal Ref when a slew rate is 100%. The heat emission from the display panel may decrease by setting the slew rate of the level shifter 170 to be lower than about 100% to increase the rising time TR and/or the falling time TF of a clock signal.

According to some embodiments, the rising times TR of the first clock signal SC_CK, the second clock signal SS_CK, and the third clock signal CR_CK and the falling times TF of the second clock signal SS_CK and the third clock signal CR_CK may be set to be long, and the falling time TF of the first clock signal SC_CK may be set to be short. For example, gradients of the rising edges RE of the first clock signal SC_CK, the second clock signal SS_CK, and the third clock signal CR_CK may be identical to each other, and a gradient of the falling edge FE of the first clock signal SC_CK may be greater than gradients of the falling edges FE of the second clock signal SS_CK and the third clock signal CR_CK.

Voltages of the first clock signal SC_CK, the second clock signal SS_CK, and the third clock signal CR_CK may increase (be changed) from low voltages to high voltages. The high voltages of the first clock signal SC_CK, the second clock signal SS_CK, and the third clock signal CR_CK may be maintained from a second point in time t2 to a third point in time t3. The voltage of the first clock signal SC_CK may decrease (be changed) from a high voltage to a low voltage from the third point in time t3 to a fourth point in time t4. The voltages of the second clock signal SS_CK and the third clock signal CR_CK may decrease (be changed) from a high voltage to a low voltage from the third point in time t3 to a fifth point in time t5. The first clock signal SC_CK may be pulled down faster than the second clock signal SS_CK and the third clock signal CR_CK.

The first rising time TR1 of the first clock signal SC_CK, the second rising time TR2 of the second clock signal SS_CK, and the third rising time TR3 of the third clock signal CR_CK may be identical to each other. The second falling time TF2 of the second clock signal SS_CK may be identical to the third falling time TF3 of the third clock signal CR_CK, and the first falling time TF1 of the first clock signal SC_CK may be shorter than the second falling time TF2 of the second clock signal SS_CK and the third falling time TF3 of the third clock signal CR_CK. The first falling time TF1 of the first clock signal SC_CK may be shorter than the first rising time TR1 thereof. The first on time TO1 of the first clock signal SC_CK, the second on time TO2 of the second clock signal SS_CK, and the third on time TO3 of the third clock signal CR_CK may be identical to each other. Accordingly, the second pulse width TW2 of the second clock signal SS_CK may be identical to the third pulse width TW3 of the third clock signal CR_CK, and the first pulse width TW1 of the first clock signal SC_CK may be less than the second pulse width TW2 of the second clock signal SS_CK and the third pulse width TW3 of the third clock signal CR_CK.

As described above with reference to FIG. 6, the first scan signal SC, the second scan signal SS, and the carry signal CR, which are output from the stage ST, may be generated according to the first clock signal SC_CK, the second clock signal SS_CK, and the third clock signal CR_CK, respectively. Therefore, as illustrated in FIG. 7B, waveforms of the first scan signal SC, the second scan signal SS, and the carry signal CR may be identical to those of the first clock signal SC_CK, the second clock signal SS_CK, and the third clock signal CR_CK, respectively. That is, a rising time of the first scan signal SC may be identical to rising times of the second scan signal SS and the carry signal CR, and a falling time of the first scan signal SC may be shorter than falling times of the second scan signal SS and the carry signal CR.

The first clock signal SC_CK may be a signal used to generate the first scan signal SC configured to turn on the second transistor T2 of the pixel circuit PC to apply a data signal to a pixel. According to some embodiments, the heat emission may be reduced by setting the rising times TR and the falling times TF of the first clock signal SC_CK, the second clock signal SS_CK, and the third clock signal CR_CK to be longer than those of the reference clock signal Ref, and the image quality features may be secured by setting the falling time TF of the first clock signal SC_CK to be shorter than the falling times TF of the second clock signal SS_CK and the third clock signal CR_CK so that the image quality may be maintained.

According to some embodiments, the falling time TF of the first clock signal SC_CK may be maintained as illustrated in FIG. 7A, and according to a heat emission target of the display panel, the rising time of the first clock signal SC_CK and the rising and falling times of the second clock signal SS_CK and the third clock signal CR_CK may be changed.

Figure 8A:
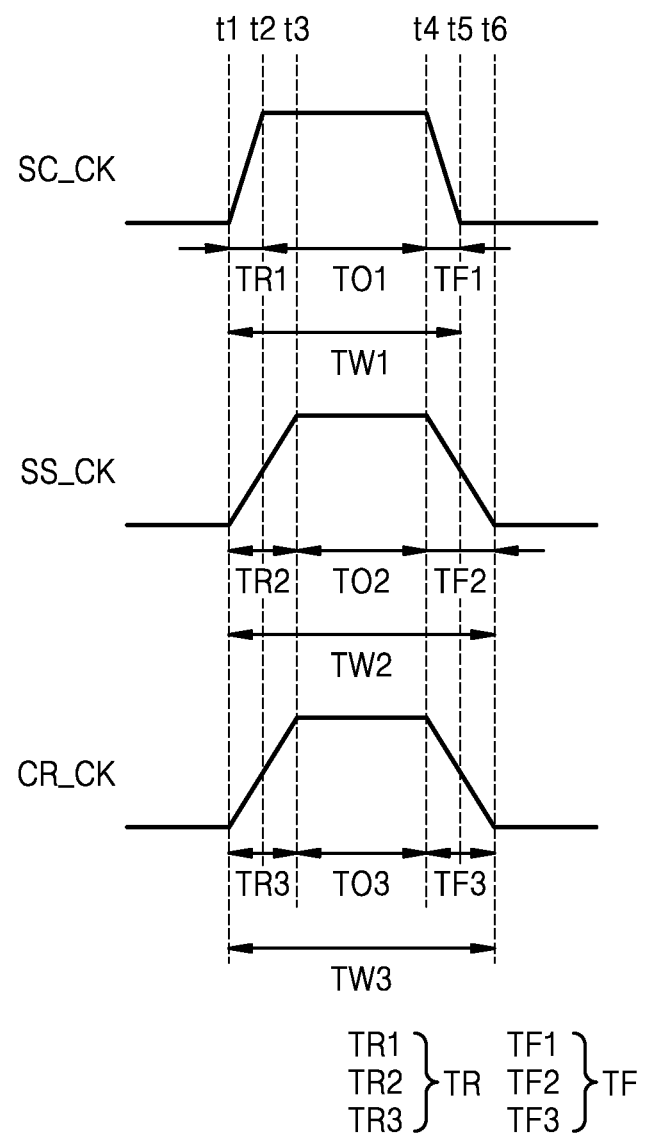
FIGS. 8A and 8B are diagrams illustrating pulses of a clock signal and a scan signal, according to some embodiments.
Figure 8B:
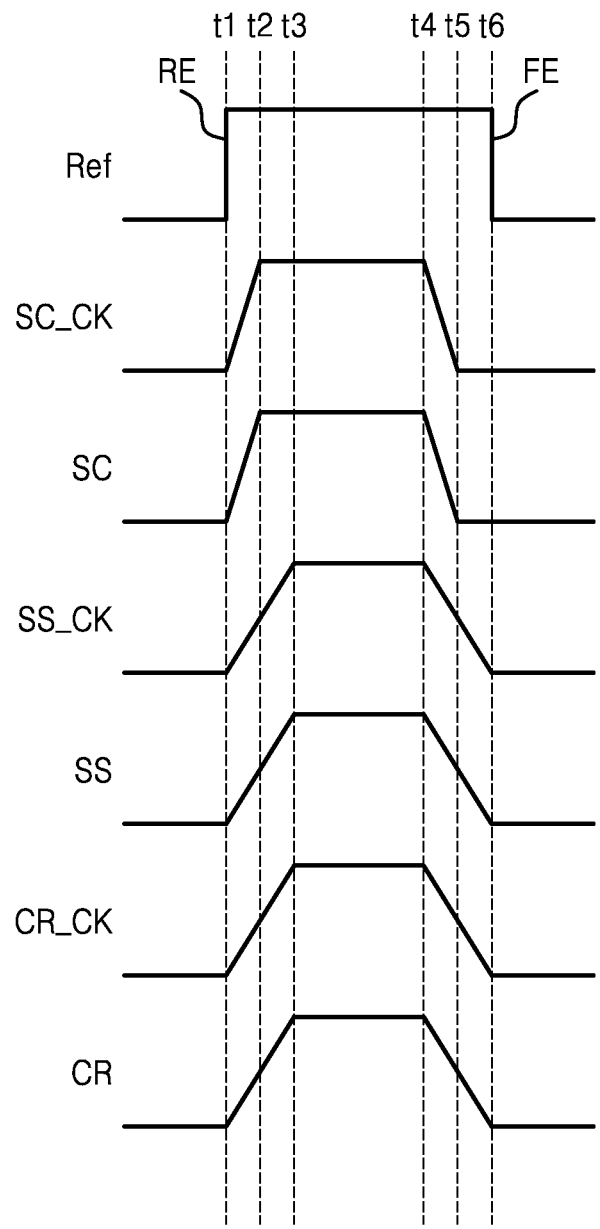

FIGS. 8A and 8B are diagrams illustrating pulses of a clock signal and a scan signal, according to some embodiments.

The embodiments of FIGS. 8A and 8B are different from those of FIGS. 7A and 7B in that the rising time TR of the first clock signal SC_CK is changed. Referring to FIGS. 8A and 8B, the rising times TR and the falling times TF of the second clock signal SS_CK and the third clock signal CR_CK may be set to be long, and the rising time TR and the falling time TF of the first clock signal SC_CK may be set to be short. For example, the gradients of the rising edge RE and the falling edge FE of the first clock signal SC_CK may be greater than those of the rising edges RE and the falling edges FE of the second clock signal SS_CK and the third clock signal CR_CK.

The voltage of the first clock signal SC_CK may increase from a low voltage to a high voltage from the first point in time t1 to the second point in time t2. The voltages of the second clock signal SS_CK and the third clock signal CR_CK may increase from low voltages to high voltages from the first point in time t1 to the third point in time t3. The high voltage of the first clock signal SC_CK may be maintained from the second point in time t2 to the fourth point in time t4. The high voltages of the second clock signal SS_CK and the third clock signal CR_CK may be maintained from the third point in time t3 to the fourth point in time t4. The voltage of the first clock signal SC_CK may decrease from the high voltage to the low voltage from the fourth point in time t4 to the fifth point in time t5. The voltages of the second clock signal SS_CK and the third clock signal CR_CK may decrease from the high voltage to the low voltage from the fourth point in time t4 to a sixth point in time t6. The first clock signal SC_CK may be pulled up and down faster than the second clock signal SS_CK and the third clock signal CR_CK.

The second rising time TR2 of the second clock signal SS_CK may be identical to the third rising time TR3 of the third clock signal CR_CK, and the first rising time TR1 of the first clock signal SC_CK may be shorter than the second rising time TR2 of the second clock signal SS_CK and the third rising time TR3 of the third clock signal CR_CK. The second falling time TF2 of the second clock signal SS_CK may be identical to the third falling time TF3 of the third clock signal CR_CK, and the first falling time TF1 of the first clock signal SC_CK may be shorter than the second falling time TF2 of the second clock signal SS_CK and the third falling time TF3 of the third clock signal CR_CK. The second on time TO2 of the second clock signal SS_CK may be identical to the third on time TO3 of the third clock signal CR_CK, and the first on time TO1 of the first clock signal SC_CK may be longer than the second on time TO2 of the second clock signal SS_CK and the third on time TO3 of the third clock signal CR_CK. The second pulse width TW2 of the second clock signal SS_CK may be identical to the third pulse width TW3 of the third clock signal CR_CK, and the first pulse width TW1 of the first clock signal SC_CK may be less than the second pulse width TW2 of the second clock signal SS_CK and the third pulse width TW3 of the third clock signal CR_CK.

As illustrated in FIG. 8B, waveforms of the first scan signal SC, the second scan signal SS, and the carry signal CR may be identical to those of the first clock signal SC_CK, the second clock signal SS_CK, and the third clock signal CR_CK, respectively. That is, the rising time of the first scan signal SC may be shorter than the rising times of the second scan signal SS and the carry signal CR, and the falling time of the first scan signal SC may be shorter than the falling times of the second scan signal SS and the carry signal CR.

According to some embodiments, the pre-charging of the first scan line SCL according to the first scan signal SC may be reinforced by setting the first rising time TR1 of the first clock signal SC_CK to be short and the first on time TO1 thereof to be long.

Figure 9A:
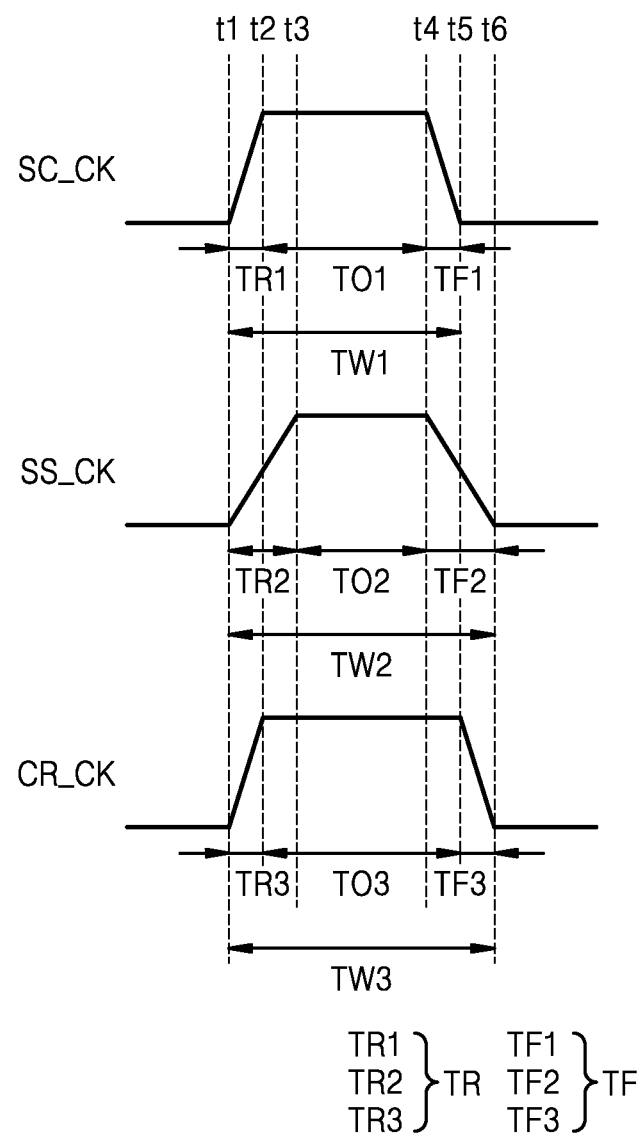
FIGS. 9A and 9B are diagrams illustrating pulses of a clock signal and a scan signal, according to some embodiments.
Figure 9B:
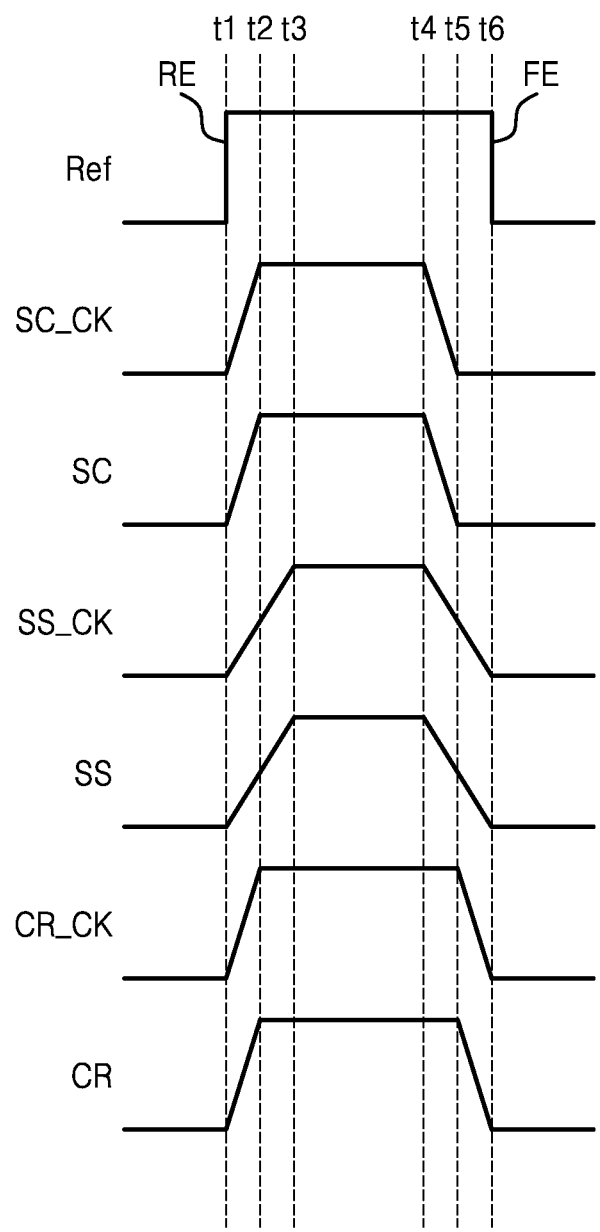

FIGS. 9A and 9B are diagrams illustrating pulses of a clock signal and a scan signal, according to some embodiments.

Compared to the embodiments of FIGS. 8A and 8B, in the embodiments of FIGS. 9A and 9B, the third rising time TR3 and the third falling time TF3 of the third clock signal CR_CK are changed. Referring to FIGS. 9A and 9B, the third rising time TR3 and the third falling time TF3 of the third clock signal CR_CK may be set short, and the third on time TO3 thereof may be set long. For example, the gradients of the rising edges RE of the first clock signal SC_CK and the third clock signal CR_CK may be greater than the gradient of the rising edge RE of the second clock signal SS_CK. According to some embodiments, the gradient of the falling edge FE of the first clock signal SC_CK may be greater than the gradients of the falling edges FE of the second clock signal SS_CK and the third clock signal CR_CK. According to some embodiments, the gradient of the falling edge FE of the first clock signal SC_CK may be identical to the gradient of the falling edge FE of the third clock signal CR_CK. Alternatively, the gradient of the falling edge FE of the first clock signal SC_CK may be less than the gradient of the falling edge FE of the third clock signal CR_CK.

The voltages of the first clock signal SC_CK and the third clock signal CR_CK may increase from a low voltage to a high voltage from the first point in time t1 to the second point in time t2. The voltage of the second clock signal SS_CK may increase from a low voltage to a high voltage from the second point in time t2 to the third point in time t3. The high voltage of the first clock signal SC_CK may be maintained from the second point in time t2 to the fourth point in time t4. The high voltage of the second clock signal SS_CK may be maintained from the third point in time t3 to the fourth point in time t4. The voltage of the first clock signal SC_CK may fall from the high voltage to the low voltage from the fourth point in time t4 to the fifth point in time t5. The voltage of the second clock signal SS_CK may fall from the high voltage to the low voltage from the fourth point in time t4 to the sixth point in time t6. The voltage of the third clock signal CR_CK may fall from the high voltage to the low voltage from the fifth point in time t5 to the sixth point in time t6. The first clock signal SC_CK and the third clock signal CR_CK may be pulled up faster than the second clock signal SS_CK. The first clock signal SC_CK may be pulled down faster than the second clock signal SS_CK and the third clock signal CR_CK.

The first rising time TR1 of the first clock signal SC_CK may be identical to the third rising time TR3 of the third clock signal CR_CK and shorter than the second rising time TR2 of the second clock signal SS_CK. The first falling time TF1 of the first clock signal SC_CK, the second falling time TF2 of the second clock signal SS_CK, and the third falling time TF3 of the third clock signal CR_CK may be different from each other. The first falling time TF1 of the first clock signal SC_CK may be identical to or different from the third falling time TF3 of the third clock signal CR_CK. The first on time TO1 of the first clock signal SC_CK, the second on time TO2 of the second clock signal SS_CK, and the third on time TO3 of the third clock signal CR_CK may be different from each other. The first on time TO1 of the first clock signal SC_CK and the third on time TO3 of the third clock signal CR_CK may be longer than the second on time TO2 of the second clock signal SS_CK. The second pulse width TW2 of the second clock signal SS_CK may be identical to the third pulse width TW3 of the third clock signal CR_CK, and the first pulse width TW1 of the first clock signal SC_CK may be less than the second pulse width TW2 of the second clock signal SS_CK and the third pulse width TW3 of the third clock signal CR_CK.

As illustrated in FIG. 9B, the waveforms of the first scan signal SC, the second scan signal SS, and the carry signal CR may be identical to those of the first clock signal SC_CK, the second clock signal SS_CK, and the third clock signal CR_CK, respectively. That is, the rising time of the first scan signal SC may be identical to that of the carry signal CR and shorter than that of the second scan signal SS, and the falling time of the first scan signal SC may be shorter than that of the second scan signal SS. The falling time of the first scan signal SC may be identical to or different from the falling time of the carry signal CR.

According to some embodiments, the stage operation characteristics of the scan driver may be improved by setting the rising time TR and the falling time TF of the third clock signal CR_CK to be short and the third on time TO3 thereof to be long.

Figure 10:
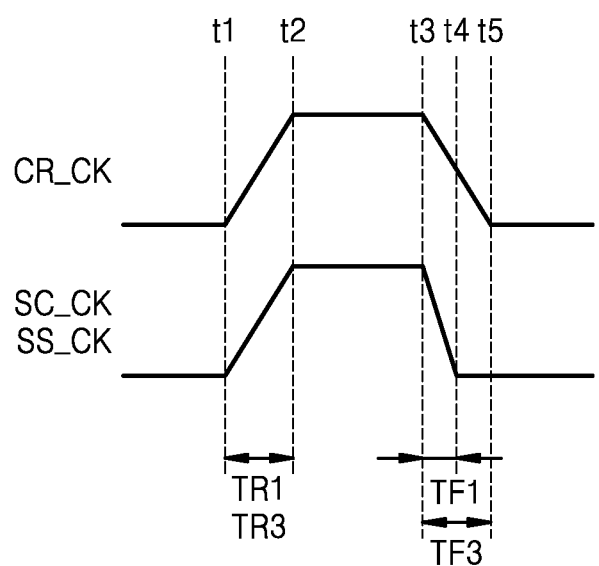
FIG. 10 is a diagram illustrating a pulse of a clock signal, according to some embodiments.

FIG. 10 is a diagram illustrating a pulse of a clock signal, according to some embodiments.

The embodiments described with respect to FIG. 10 are different from the embodiments described with respect to FIG. 7A in that the first clock signal SC_CK is combined with the second clock signal SS_CK. In this case, in the embodiments described with respect to FIG. 6, one of the first output controller 135 and the second output controller 137 may be omitted. For example, the second output controller 137 of each stage ST may be omitted, and the level shifter 170 may not output the second clock signal SS_CK and may output the first clock signal SC_CK to the scan driver 130. The first clock signal SC_CK may be output to the first scan line SCL and the second scan line SSL as the first scan signal SC and the second scan signal SS through the first output terminal OUT1 of the first output controller 135. The first rising time TR1 of the first clock signal SC_CK and the second clock signal SS_CK may be identical to the third rising time TR3 of the third clock signal CR_CK. The first falling time TF1 of the first clock signal SC_CK and the second clock signal SS_CK may be shorter than the third falling time TF3 of the third clock signal CR_CK.

In the embodiments of the present disclosure, the rising times TR and the falling times TF of the second clock signal SS_CK and the third clock signal CR_CK, which are irrelevant to the image quality, may be set to be long to reduce the heat emission from the display panel, and the falling time TF of the first clock signal SC_CK, which is relevant to the image quality, may be shorter than the rising time TR thereof.

In the embodiments of the present disclosure, a rising time TR, a falling time TF, and an on time TO of a clock signal may indicate a rising time TR, a falling time TF, and an on time TO of a pulse of a clock signal, respectively.

A circuit of the stage ST of FIG. 6 is illustrative, and circuit elements forming the node controller 131, the first output controller 135, the second output controller 137, and the third output controller 139 and connection relationships therebetween may vary, and the one or more embodiments of the disclosure may be applied to a stage ST configured to output the first scan signal SC and the second scan signal SS to the pixel circuit PC of FIG. 2 by respectively using the first clock signal SC_CK, the second clock signal SS_CK, and the third clock signal CR_CK.

According to one or more embodiments, there may be provided a scan driver for reducing the heat emission from a display panel and a display apparatus including the scan driver. Effects of the disclosure are not limited to those stated above and may variously expand without departing from the scope of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A scan driver comprising a plurality of stages, wherein each of the plurality of stages comprises:
a node controller configured to control a voltage level of a first control node;
a first output controller comprising a first pull-up transistor connected between a first clock input terminal configured to receive a first clock signal, and a first output terminal and configured to output the first clock signal as a first scan signal in response to the first control node having an on-voltage level;
a second output controller comprising a second pull-up transistor connected between a second clock input terminal and configured to receive a second clock signal, and a second output terminal and configured to output the second clock signal as a second scan signal in response to the first control node having the on-voltage level; and
a third output controller comprising a third pull-up transistor connected between a third clock input terminal configured to receive a third clock signal, and a third output terminal and configured to output the third clock signal as a carry signal in response to the first control node having the on-voltage level,
wherein a falling time of the first clock signal is shorter than falling times of the second clock signal and the third clock signal.

2. The scan driver of claim 1, wherein a rising time of the first clock signal is identical to rising times of the second clock signal and the third clock signal.

3. The scan driver of claim 1, wherein a rising time of the first clock signal is shorter than rising times of the second clock signal and the third clock signal.

4. The scan driver of claim 1, wherein a rising time of the first clock signal is identical to a rising time of the third clock signal and shorter than a rising time of the second clock signal.

5. The scan driver of claim 1, wherein an on time of the first clock signal is identical to on times of the second clock signal and the third clock signal, the on time being a period in response to the on-voltage level being maintained.

6. The scan driver of claim 1, wherein an on time of the first clock signal is longer than on times of the second clock signal and the third clock signal, the on time being a period in response to the on-voltage level being maintained.

7. The scan driver of claim 1, wherein an on time of the first clock signal is longer than an on time of the second clock signal and shorter than an on time of the third clock signal, the on time being a period in response to the on-voltage level being maintained.

8. The scan driver of claim 1, wherein the first clock signal is transited from an on-voltage level to an off-voltage level in a same point in time as transition points in time of the second and third clock signals, and the first clock signal is transited to the off-voltage level faster than the second and third clock signals.

9. The scan driver of claim 8, wherein the first clock signal is transited from the off-voltage level to the on-voltage level in a same point in time as the transition points in time of the second and third clock signals, and the first clock signal is transited to the on-voltage level faster than the second and third clock signals.

10. The scan driver of claim 1, wherein the first clock signal is transited from an on-voltage level to an off-voltage level in a same point in time as a transition point in time of the second clock signal and is transited to the off-voltage level faster than the second clock signal, and
the first clock signal is transited from the off-voltage level to the on-voltage level in the same point in time as the transition point in time of the second clock signal and transited to the on-voltage level faster than the second clock signal.

11. The scan driver of claim 10, wherein a period of time that the third clock signal maintains the on-voltage level is greater than periods of time that the first and second clock signals maintain the on-voltage level.

12. The scan driver of claim 1, further comprising an inverter connected between the first control node and a second control node and configured to invert a voltage of the first control node and to provide an inverted voltage to the second control node,
wherein the first output controller comprises a first pull-down transistor connected between a first voltage input terminal configured to receive a first voltage having an off-voltage level is applied, and the first output terminal and configured to output the first voltage as the first scan signal in response to, the second control node having an on-voltage level,
the second output controller comprises a second pull-down transistor connected between the first voltage input terminal and the second output terminal and configured to output the first voltage as the second scan signal in response to the second control node having the on-voltage level, the third output controller comprises a third pull-down transistor connected between a second voltage input terminal, to which a second voltage having an off-voltage level is applied, and the third output terminal and configured to output the second voltage as the carry signal in response, to the second control node having the on-voltage level, and the first voltage is lower than the second voltage.

13. A display apparatus comprising:

a pixel unit comprising a plurality of pixels; and a scan driver comprising a plurality of stages configured to respectively output a first scan signal and a second scan signal to the plurality of pixels, wherein each of the plurality of stages comprises:

a node controller configured to control a voltage level of a first control node;

a first output controller configured to output a first clock signal as the first scan signal in response to the first control node having an on-voltage level;

a second output controller configured to output a second clock signal as the second scan signal in response to the first control node having the on-voltage level; and a third output controller configured to output a third clock signal as a carry signal in response to the first control node having the on-voltage level, wherein a falling time of the first clock signal is shorter than falling times of the second and third clock signals.

14. The display apparatus of claim 13, wherein a rising time of the first clock signal is identical to rising times of the second and third clock signals.

15. The display apparatus of claim 13, wherein a rising time of the first clock signal is shorter than rising times of the second and third clock signals.

16. The display apparatus of claim 13, wherein a rising time of the first clock signal is identical to a rising time of the third clock signal and shorter than a rising time of the second clock signal.

17. The display apparatus of claim 13, wherein an on time of the first clock signal is identical to on times of the second and third clock signals, the on time being a period in response to the on-voltage level being maintained.

18. The display apparatus of claim 13, wherein an on time of the first clock signal is longer than on times of the second and third clock signals, the on time being a period in response to the on-voltage level being maintained.

19. The display apparatus of claim 13, wherein an on time of the first clock signal is longer than an on time of the second clock signal and shorter than an on time of the third clock signal, the on time being a period that the on-voltage level is maintained.

20. The display apparatus of claim 13, further comprising an inverter connected between the first control node and a second control node and configured to invert a voltage of the first control node and provide an inverted voltage to the second control node, wherein the first output controller is configured to output a first voltage having an off-voltage level as the first scan signal in response to the second control node having the on-voltage level, the second output controller is configured to output the first voltage having the off-voltage level as the second scan signal in response to the second control node having the on-voltage level, the third output controller is configured to output a second voltage having the off-voltage level as the carry signal in response to the second control node having the on-voltage level, and the first voltage is lower than the second voltage.

* * * * *